United States Patent
Taniguchi

(10) Patent No.: US 6,327,483 B1
(45) Date of Patent: Dec. 4, 2001

(54) MOBILE RADIO COMMUNICATION EQUIPMENT

(75) Inventor: Keiichi Taniguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/249,703

(22) Filed: Feb. 12, 1999

(30) Foreign Application Priority Data

Feb. 20, 1998 (JP) .................................................. 10-038456

(51) Int. Cl.$^7$ ...................................................... H04B 1/38
(52) U.S. Cl. .............................................................. 455/575
(58) Field of Search ............................ 455/575, 95, 513, 455/67.3

(56) References Cited

U.S. PATENT DOCUMENTS

| | | | |
|---|---|---|---|
| 4,380,824 | * 4/1983 | Inoue | 455/143 |
| 5,175,875 | * 12/1992 | Yokoya et al. | 455/89 |
| 5,603,106 | * 2/1997 | Toda | 455/126 |
| 6,038,428 | * 3/2000 | Mizusawa | 455/69 |
| 6,144,860 | * 11/2000 | Komatsu | 455/522 |

FOREIGN PATENT DOCUMENTS

| | | |
|---|---|---|
| WO 97/33419 | 9/1997 | (GB) . |
| 61-168747 | 10/1986 | (JP) . |
| 63-10622 | 1/1988 | (JP) . |
| 1-284128 | 11/1989 | (JP) . |
| 4-35144 | 2/1992 | (JP) . |
| 4 82331 | 3/1992 | (JP) . |
| 4-82331 | 3/1992 | (JP) . |
| 7 307697 | 11/1995 | (JP) . |
| 7-307697 | 11/1995 | (JP) . |
| 9-270847 | 10/1997 | (JP) . |
| 10-23114 | 1/1998 | (JP) . |

* cited by examiner

Primary Examiner—Daniel Hunter
Assistant Examiner—Thuan T. Nguyen
(74) Attorney, Agent, or Firm—Scully, Scott, Murphy & Presser

(57) ABSTRACT

A level detector 81 detects and calculates a power value A1 of a d.c. component of a transmitting audio signal. A subtractor 82 calculates a difference between a transmitting power value A1 and a reference power value A0 written in a memory 14 to obtain an amplification degree A2 which is temporarily stored in a memory portion 11. When a receiving audio signal is inputted through an audio signal processing portion 5 to an amplifier 83 of a signal comparator portion 8 at a next timing, the amplification degree A2 of the receiving sound read out from the memory portion 11 is read out to variably control a gain of the amplifier 83 to thereby amplify the receiving audio signal A2 times. Thus, a receiving sound volume can be variably regulated according to a transmitting sound volume.

6 Claims, 2 Drawing Sheets

MOBILE RADIO COMMUNICATION EQUIPMENT

CROSS REFERENCE TO RELATED APPLICATIONS

The present invention claims priority from Japanese Patent Application No. 10-038456 filed Feb. 20, 1998, the contents of which are incorporated herein by reference.

BACKGROUND OF THE INVENTION

1. Field of the Invention

The present invention relates to a mobile radio communication equipment and, particularly, to a mobile radio communication equipment having a function of regulating a sound volume of voice which is being listened by a user of the mobile radio communication equipment.

2. Description of Related Art

In a conventional mobile radio communication equipment having a function of regulating a sound volume of voice which is being listened by a user of the equipment, the sound volume is regulated by the user himself by manually operating a volume key preliminarily provided on the equipment so that the sound volume of listening voice becomes desirable regardless of existing environmental noise.

In such conventional radio communication equipment, however, when a sound volume on a transmitting side is small, there is a possibility that a sound volume on the receiving side becomes small necessarily, so that the user on the receiving side must manually operate the volume key, resulting in that a convenience of the user is lost. Further, the user must manually operate the volume key every time the sound volume and/or ambient noise on the receiving side varies, resulting in low operability of the equipment.

Under such circumstances, a mobile radio communication equipment provided with a noise sensor for detecting background noise has been proposed in, for example, Japanese Patent Application Laid-open No. Hei 4-822331, in which a background noise level detected by the noise sensor is compared with a threshold value based on a signal input from a key pad and a receiving sound volume of a loudspeaker is regulated correspondingly to a result of the comparison.

Further, another mobile radio communication equipment has been proposed in, for example, Japanese Patent Application Laid-open No. Hei 7-307697, in which an average value of an audio signal output from a transmitter is compared with a reference level of ambient noise, it is recognized whether or not the audio signal output from the transmitter is a transmitting sound and a receiving sound volume is automatically regulated correspondingly to the ambient noise level by controlling a gain of a variable gain amplifier for amplifying the receiving sound, on the basis of a result of the comparison and a result of the recognition.

In the former one of the above mentioned conventional mobile radio communication equipments, which is provided with the noise sensor, it is possible to automatically regulate according to the ambient noise level. However, the noise sensor dedicated to ambient noise detection must be additionally provided to the transmitter/receiver. Therefore, the number of parts of the mobile radio communication equipment is increased and a space for mounting the noise sensor is necessary in the mobile radio communication equipment, which are inconvenient for the mobile radio communication equipment which should be compact and light-weight.

According to the latter one of the conventional mobile radio communication equipment, it is possible to automatically regulate the receiving sound volume according to the level of ambient noise. However, it is necessary to confirm from the transmitting audio signal output whether or not the transmitting audio signal is a transmitting sound. In order to do so, the average value of the output audio signal from the transmitter is compared with the audio signal. However, depending upon the volume of the ambient noise, it is impossible to exactly know whether or not the audio signal is the transmitting sound. Therefore, there may be an error of receiving volume regulation, causing a problem in reliability to occur. Further, it is impossible for individual users to regulate the sound volume to values optimal for them.

SUMMARY OF THE INVENTION

An object of the present invention is to provide a mobile radio communication equipment capable of automatically regulating a receiving sound volume while a communication is being made, without necessity of increase of the number of parts thereof and a space thereof for mounting additional circuit.

Another object of the present invention is to provide a mobile radio communication equipment capable of automatically and more reliably regulating the receiving sound volume to an optimal value while a communication is being made.

In order to achieve the above objects, a mobile radio communication equipment according to the present invention comprises receiving means for converting an audio signal received from a remote side equipment connected to a radio network into a receiving audio signal, a loudspeaker portion for converting the receiving audio signal into a voice output, a microphone portion for collecting voice of a user of the mobile radio communication equipment and converting the collected voice into a transmitting audio signal, a signal comparator portion for calculating a transmitting power value of the transmitting audio signal, comparing the transmitting power value with a reference power value, amplifying the receiving audio signal input from the receiving means with an amplification degree corresponding to a result of the comparison and supplying the amplified audio signal to the loudspeaker portion and transmitting means for transmitting the transmitting audio signal.

Since, in the present invention, the receiving audio signal of the remote side equipment received by the receiving means is output as the voice by the loudspeaker portion after amplified with the amplification degree corresponding to the result of the comparison of the transmitting power value with the reference power value performed by the signal comparison portion and converted into the voice by the loudspeaker portion, the user can automatically regulate the receiving sound volume to a value desired by the user according to the volume of the transmitting voice of the user input through the microphone portion originally provided on the mobile radio communication equipment, without necessity of manual operation of a volume key by the user and without necessity of providing a noise sensor.

The signal comparator portion may comprise a level detector for extracting a level of a predetermined frequency component of the transmitting audio signal and calculating the power value thereof, a subtractor for calculating a difference between the transmitting power value calculated by the level detector and the reference power value and an amplifier having a variable gain, the amplifier amplifying the receiving audio signal with the gain controlled such that the difference corresponding to the transmitting power value becomes the amplification degree of the amplifier and supplying the amplified receiving audio signal to the loudspeaker portion.

The level detector may be constructed such that it extracts a level of a d.c. component of the transmitting audio signal, squares the extracted level and calculates an average value of the squared d.c. component as the transmitting power value.

An initial value of the difference calculated by the subtractor is set to 0(dB), and the receiving audio signal input initially after a communication is started may be passed through the amplifier with the level of the receiving audio signal being kept as it is to the loudspeaker portion. The difference calculated by the subtractor is stored in a memory portion temporarily and is read out therefrom to control the amplification degree of the amplifier in amplifying the receiving audio signal input thereafter.

The memory portion may have a construction which stores a user data such as address note and is capable of updating a portion of the content thereof according to an instruction from the user or the receiving means.

BRIEF DESCRIPTION OF THE DRAWINGS

Preferred embodiments of the present invention will be described with reference to the accompanying drawings, in which.

DETAILED DESCRIPTION OF THE PREFERRED EMBODIMENTS

Figure 1:
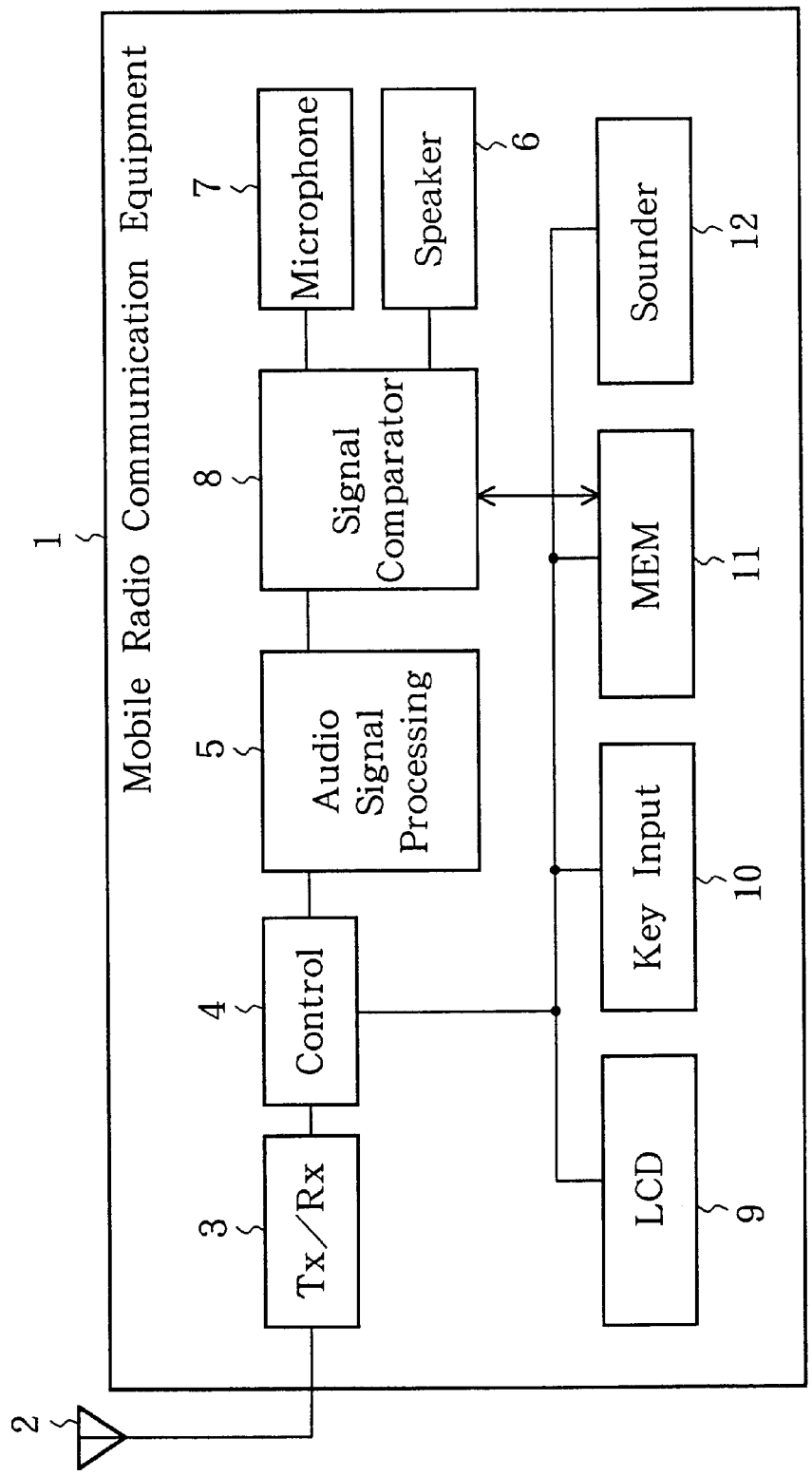
FIG. 1 is a block diagram of a mobile radio communication equipment according to an embodiment of the present invention.

FIG. 1 is a block diagram of an embodiment of the mobile radio communication equipment of the present invention. In FIG. 1, the mobile radio communication equipment 1 is constructed with a radio portion 3 which is connected to an antenna 2 and transmits/receives a radio frequency signal, a control portion 4 for instructing operations of respective portions according to a program preliminarily written therein, an audio signal processing portion 5 for converting an analog audio signal to be transmitted into a digital audio signal, vice versa, a loudspeaker portion 6 for reproducing the analog audio signal converted by the audio signal processing portion from a received digital audio signal, a microphone portion 7 for collecting a user voice, a signal comparator portion 8, a liquid crystal display (LCD) portion 9 connected to the control portion 4, a key input portion 10, a memory portion 11 and a sounder portion 12.

The LCD portion 9 displays various information under control of the control portion 4. The key input portion 10 is provided for inputting various information to the mobile radio communication equipment 1 by a user. The memory portion 11 stores a user data such as address note and has a construction capable of updating a portion of the stored content according to an instruction of the user or the control portion 4. The sounder portion 12 notifies the user various situation of the mobile radio communication equipment 1 such as "dead battery".

Figure 2:
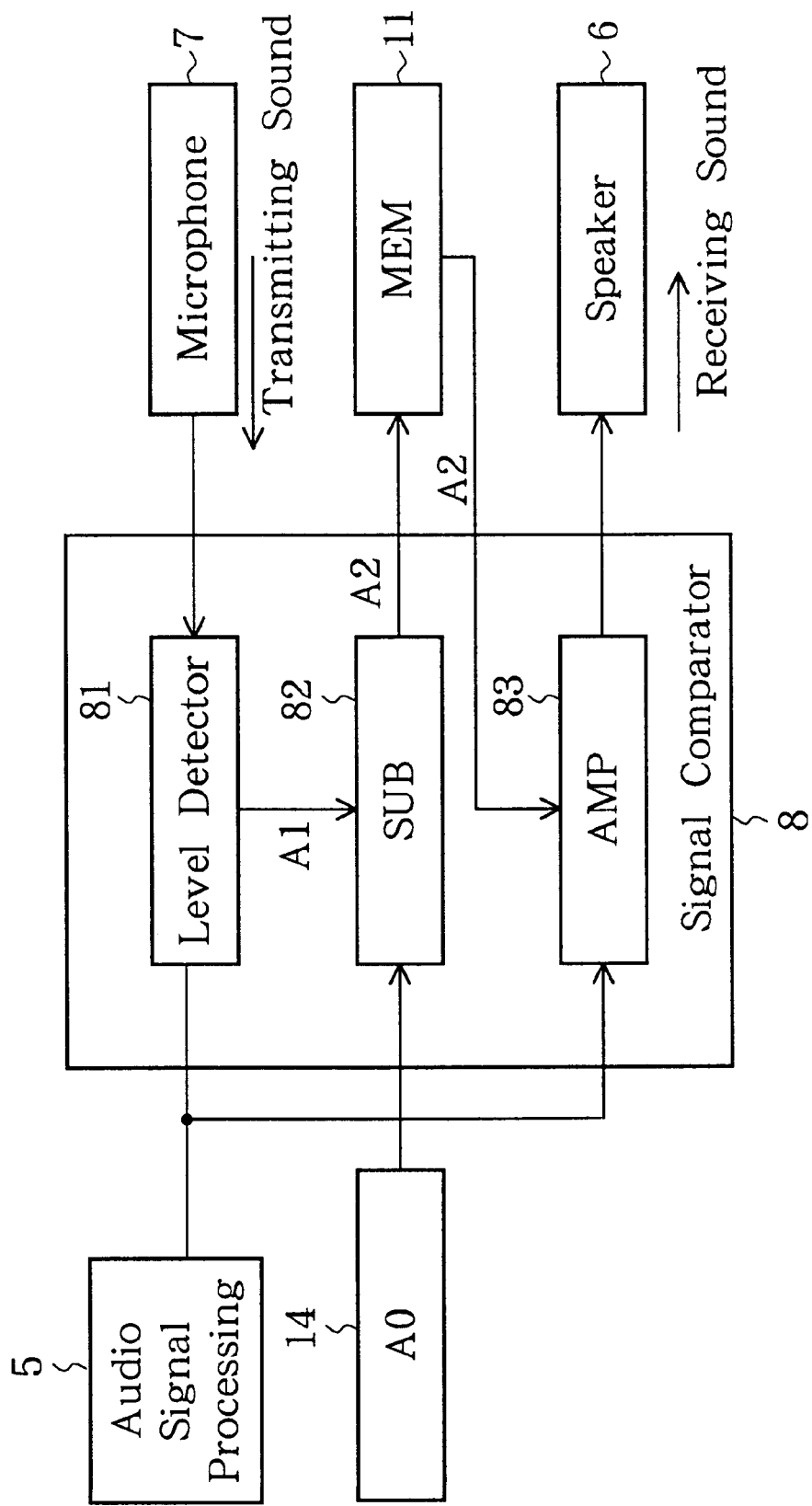
FIG. 2 is a block diagram of an example of a signal comparator portion of the embodiment shown in FIG. 1.

FIG. 2 is a block diagram of the signal comparator portion 8. Same constructive portions in FIG. 2 as those shown in FIG. 1 are depicted by same reference numerals, respectively, without detailed description thereof. In FIG. 2, the signal comparator portion 8 is constructed with a level detector 81, a subtractor 82 and an amplifier 83. The level detector 81 detects a level of an analog audio signal obtained by the microphone portion 7 through a sound-electric conversion of voice of the user collected by the microphone portion 7.

The subtractor 82 calculates a difference between a reference power value A0 preliminarily set in the memory 14 and an output level detection signal from the level detector 81 as an amplification degree of the amplifier 83. Although the memory 14 is provided in the control portion 4 in the embodiment, the memory 14 may be provided separately from the control portion 4 or a portion of the memory portion 11 may be used as the memory 14. The amplifier 83 is a variable gain amplifier which amplifies the receiving audio signal input from the audio signal processing portion 5 with gain corresponding to the amplification degree calculated by the subtractor 82.

Now, an operation of the embodiment shown in FIGS. 1 and 2 will be described. In FIG. 1, when a radio communication is started after a radio connection between the mobile radio communication equipment 1 and an arbitrary remote side equipment is established, an audio signal generated in the remote side equipment is converted into an audio signal wave having a predetermined signal format and transmitted. The audio signal wave is received by the antenna 2 of the mobile radio communication equipment 1. The audio signal wave received by the antenna 2 is processed, for example, high frequency-amplified, by the radio portion 3 and supplied to the audio signal processing portion 5 through the control portion 4 by which it is converted into an analog audio signal. The remote side analog audio signal derived from the audio signal processing portion 5, that is, the receiving audio signal, is supplied through the signal comparator portion 8 to be described to the loudspeaker portion 6 by which it is converted into the receiving voice.

On the other hand, a transmitting voice of the user of the mobile radio communication equipment 1 is collected and converted into an electric audio signal by the microphone portion 7. The electric audio signal is supplied through the signal comparator portion 8 to the audio signal processing portion 5 and converted into a digital signal having a predetermined format. Then, the digital signal is passed through the control portion 4 and the radio portion 3 and transmitted from the antenna 2 as an audio signal wave having frequency in a transmitting frequency band.

The signal comparator portion 8 operates in the following manner during the communication. In FIG. 2, the level detector 81 of the signal comparator portion 8 extracts a spectrum of the transmitting audio signal inputted from the microphone portion 7 every predetermined time and, then, extracts a signal to be measured which is a predetermined component of the extracted spectrum. The predetermined component to be measured is not defined specifically. However, it is assumed in this embodiment to extract a level of a d.c. component, that is, a level of the extracted spectrum at frequency=0, as the signal to be measured.

Then, the level detector 81 detects an electric power corresponding to the extracted signal to be measured. This detection of the electric power may be performed by, for example, obtaining a d.c. average value of a value obtained by squaring the level of the signal to be measured. In this manner, the level detector 81 detects and calculates the power value of the d.c. component of the transmitting audio signal. This transmitting power value will be described as A1.

Thereafter, the subtractor 82 subtracts the transmitting power value A1 from, for example, the reference power value A0 written in the memory 14 of the control portion 4, resulting in a difference value A2 which will be referred to as amplification degree. The amplification degree A2 indicates an amplification degree of a receiving volume and also indicates the difference of the transmitting power value A1 (that is, the audio signal which is being transmitted) calculated by the level detector 81 from the reference value A0.

It is assumed here that an initial value of the amplification degree A2 of the receiving volume is 0, that an initial value of the reference power value A0 is fixed to 0 and that A0, A1 and A2 are defined by the unit dB. The amplification degree A2 of the receiving volume calculated as above is stored in the memory portion 11 temporarily. Then, when the receiving audio signal supplied through the radio portion 3 and the control portion 4 at a next timing is input to the amplifier 83 of the signal comparator portion 8 through the audio signal processing portion 5, the amplification degree A2 of the receiving voice read out from the memory portion 11 is read out to variably control the gain of the amplifier 83 to amplify the receiving audio signal A2 times.

The operation of this embodiment will be described in more detail with reference to FIGS. 1 and 2. In order to communicate with a remote side, a user of this mobile radio communication equipment 1 dials the remote side by operating the key input portion 10. Upon the dialing, the mobile radio communication equipment 1 performs a predetermined connection operation with respect to the dialed remote side and, when the connection is established therebetween, the user can communicate with the remote side. This operation is the same as that of the conventional radio communication equipment and, so, the detailed description thereof is omitted.

When the circuit connection with respect to the remote side and the communication between the user and the remote side becomes possible, the audio signal (receiving audio signal) of a sound of the remote side (receiving sound) is input through the antenna 2, the radio portion 3, the control portion 4 and the audio signal processing portion 5 to the amplifier 83 of the signal comparator portion 8. At this time point, the user does not talk as yet and, therefore, the amplification degree A2 output from the subtractor 82 remains in the initial value of 0(dB). Therefore, the receiving audio signal is not amplified by the amplifier 83 (that is, gain 1) and supplied to the loudspeaker portion 6 as it is in which it is converted into sound and outputted therefrom.

When the user feels the receiving voice outputted from the loudspeaker portion 6 as being hard to hear (that is, the receiving sound volume is too low), he may talk with a sound volume larger than the receiving sound volume. It is assumed here that the user talks with a sound volume of +3 dB with respect to the receiving sound volume. Although it is impossible for the user to quantitatively know his own voice volume practically, it is assumed in this case that his voice volume is increased by 3 dB as a result of his talking.

The user's voice is collected by the microphone portion 7, converted into an electric transmitting audio signal and supplied to the level comparator 81 of the signal comparator portion 8, in which the transmitting power value A1 thereof is calculated as mentioned previously. In this example, A1=+3 dB. Thereafter, a difference between the transmitting power value A1 and the reference power value A0 is calculated by the subtractor 82 of the signal comparator portion 8, resulting in the amplification decree A2. Since the reference power value A0 is fixed to 0(dB), the subtractor 82 calculates the amplification degree A2 of +3 dB according to the formula A2=A1.A0=+3.0=+3(dB), which is temporarily stored in the memory portion 11.

The transmitting audio signal is level-detected by the level detector 81 and transmitted in the predetermined frequency band and in the predetermined signal format from the antenna 2 through the audio signal processing portion 5, the control portion 4 and the radio portion 3.

Then, when a next receiving audio signal is transmitted to the user and the remote side receiving audio signal is inputted to the amplifier 83 of the signal comparator portion 8 through the antenna 2, the radio portion 3, the control portion 4 and the audio signal processing portion 5, the amplifier 83 whose gain is controlled such that the amplification degree thereof becomes +3 dB on the basis of the amplification degree A2 read out from the memory portion 11 amplifies it by +3 dB and supplies it to the loudspeaker portion 6 in which the amplified audio signal is converted into sound and outputted therefrom as voice.

The user hears the receiving voice output from the loudspeaker portion 6 again to judge whether the receiving sound volume is easy to hear and, then, talks with a volume based on the result of judgement (with a larger volume than before when the receiving sound is hard to hear or with a smaller volume than before when the receiving sound volume is smaller than before). Similar operation is repeated until the radio circuit is cut off.

According to this embodiment, the user can automatically regulate the receiving sound volume to an aimed volume according to the transmitting sound volume of the user inputted to the microphone portion 7 which is originally equipped in the mobile radio communication device 1, without the user's manual operation of a volume key and without providing a noise sensor. Therefore, it is possible to automatically regulate the receiving sound volume to an optimal volume by changing the transmitting sound volume, even when the receiving sound volume is changed for some reason.

Further, since, even when ambient noise is changed, the user judges whether or not the receiving sound becomes hard to hear by the ambient noise and can regulate the receiving sound volume according to the result of judgement, the receiving sound volume regulation which is reliable compared with the prior art is possible in real time even if ambient noise is changed.

The present invention is not limited to the described embodiment. For example, the reference power value A0 can be set to other value than 0 dB in the factory side.

As described hereinbefore, according to the present invention, the user can automatically regulate the receiving sound volume to an aimed volume according to the transmitting sound volume of the user inputted to the microphone portion 7 which is originally equipped in the mobile radio communication device 1, without the user's manual operation of a volume key and without providing a noise sensor. Therefore, it is possible to automatically regulate the receiving sound volume to an optimal volume by changing the transmitting sound volume, even when the receiving sound volume is changed for some reason, thus the convenience can be improved.

Further, according to the present invention, the receiving sound volume can be regulated without providing a noise sensor and there is no increase of the number of parts and no increase of a space for mounting them, so that the size and weight of the mobile radio communication device can be reduced compared with the prior art device.

Further, according to the present invention, even when ambient noise is changed, the user judges whether or not the receiving sound becomes hard to hear by the ambient noise and can make the transmitting sound volume regulatable according to the result of judgement, there is no need of an identifying operation for identifying the transmitting sound. Therefore, receiving sound volume regulation which is reliable compared with the prior art is possible in real time even if ambient noise is changed.

What is claimed is:

1. A mobile radio communication equipment comprising:

receiving means for receiving an audio signal wave from a remote side equipment connected to said mobile radio communication equipment through a radio circuit and converting the received audio signal into a receiving audio signal;

a loudspeaker portion for converting the receiving audio signal into a sound and outputting the sound;

a microphone portion for collecting voice of a user of said mobile radio communication equipment and converting the collected voice into a transmitting audio signal;

a signal comparator portion for calculating a transmitting power value of the transmitting audio signal, comparing the transmitting power value with a reference power value, amplifying the receiving audio signal inputted from said receiving means with an amplification degree corresponding to a result of the comparison and supplying the amplified audio signal to said loudspeaker portion; and transmitting means for transmitting the transmitting audio signal to the remote side equipment.

2. A mobile radio communication equipment as claimed in claim 1, wherein said signal comparator comprises:

a level detector for extracting a level of a predetermined frequency component of the transmitting audio signal and calculating a power value thereof;

a subtractor for calculating a difference between the transmitting power value calculated by said level detector and the reference power value; and an amplifier having a gain controlled such that the difference value corresponding to the transmitting power value becomes an amplification degree thereof, said amplifier amplifying the receiving audio signal with the gain and supplying the amplified receiving audio signal to said loudspeaker portion.

3. A mobile radio communication equipment as claimed in claim 2, wherein said level detector extracts a level of a d.c. component of the transmitting audio signal, squares the extracted level and calculates an average value of the squared d.c. component as the transmitting power value.

4. A mobile radio communication equipment as claimed in claim 2, wherein an initial value of the difference calculated by said subtractor is set to 0 (dB), and the receiving audio signal inputted initially after a communication is started is passed through said amplifier to said loudspeaker portion with the level of the receiving audio signal being kept as it is.

5. A mobile radio communication equipment as claimed in claim 2, wherein the difference calculated by said subtractor is stored in a memory portion temporarily and is read out therefrom to control the amplification degree of said amplifier in amplifying the receiving audio signal inputted thereafter.

6. A mobile radio communication equipment as claimed in claim 5, wherein said memory portion stores a user data such as address note, etc., and has a construction which is capable of updating a portion of the stored content thereof according to an instruction from the user or said receiving means.

\* \* \* \* \*